United States Patent [19]

Seidel et al.

[11] Patent Number: 4,941,248
[45] Date of Patent: Jul. 17, 1990

[54] MECHANISM FOR PROCESSING AND OFFERING TAPEPAKS FOR AUTOMATIC EQUIPPING UNITS

[75] Inventors: Werner Seidel, Munich; Walter Kandler, Percha B Starnberg, both of Fed. Rep. of Germany

[73] Assignee: Siemens Aktiengesellschaft, Berlin and Munich, Fed. Rep. of Germany

[21] Appl. No.: 269,427

[22] Filed: Nov. 10, 1988

[30] Foreign Application Priority Data

Nov. 10, 1987 [DE] Fed. Rep. of Germany ....... 3738164

[51] Int. Cl.$^5$ ............................................. H01R 43/00
[52] U.S. Cl. .................................... 29/564.6; 140/105
[58] Field of Search ................. 29/564.6, 566.2, 566.3, 29/827, 835; 140/105; 83/405

[56] References Cited

U.S. PATENT DOCUMENTS

| | | | |
|---|---|---|---|
| 4,064,917 | 12/1977 | Diaz | 140/105 |
| 4,079,489 | 3/1978 | Kowalski et al. | 29/566.2 X |
| 4,103,718 | 8/1978 | Steigerwald | 140/105 |
| 4,399,610 | 8/1983 | Moyer | 29/827 |
| 4,868,978 | 9/1989 | Seidel et al. | 29/835 |

FOREIGN PATENT DOCUMENTS 0752840  8/1980  U.S.S.R. .................... 29/566.3

*Primary Examiner*—Z. R. Bilinsky
*Attorney, Agent, or Firm*—Hill, Van Santen, Steadman & Simpson

[57] ABSTRACT

A mechanism for processing tapepaks by cutting an outer frame from a component, bending the terminal legs to the desired configuration, and then transferring the processed component to a transfer station for removal by a suction device. The mechanism includes a supply station, a processing station and a transfer station. The processing station includes a punch coacting with a cut-out tool having at least one blanking die receiving a bending insert and includes a slide which is movable between the punch and cut-out tool, which slide supports a bend-transfer insert and also has a tapepak holder spaced therefrom so that when the tapepak holder is at the processing station, the bend-transfer insert is at the transfer station and in a second position of the slide with the bend-transfer insert at the processing station, the holder is at the supply station.

7 Claims, 2 Drawing Sheets

MECHANISM FOR PROCESSING AND OFFERING TAPEPAKS FOR AUTOMATIC EQUIPPING UNITS

The present invention is directed to a delivery module for automatic equipping units in which the processing and the offering of tapepaks occurs. In the module, the tapepak is prepared for soldering and is made available at a reproducible position which, for example, may be an equipping head which has suction pipettes.

The equipping of printed circuit boards with various component parts is accomplished with different techniques. One of these is what is referred to as SMD technique for "surface mounted devices". Such surface-mountable components are identified by terminal legs arranged at a plurality of sides. These legs project horizontally out of the member and are bent in a downward direction similar to a Z with 90° angles. Different types having specific designs have been developed in the course of the miniaturization of such component parts. For example, the micropak is an example of one form or type. This micropak is supplied in band form and the cutting as well as the shaping of the terminal legs occurs within a soldering mechanism.

What is referred to as the tapepak represents a further design of a highly integrated semiconductor housing system, such as the system sold under a trademark of LSI semiconductor housing system. This system is a component part that is likewise manufactured on the basis of a copper band and comprises a great plurality of terminal legs, for example 124 such terminals. In addition, a tapepak comprises a protective frame that is removed before mounting. This protective frame contains test contacts via which various tests of the component part can be carried out.

SUMMARY OF THE INVENTION

The object of the invention is to offer a delivery unit for, for example, automatic equipping units within which the tapepaks comprising their appertaining frame can be prepared for soldering and can be simultaneously offered at a reproducible position, for example for removal with an equipping head.

This object is achieved with a mechanism for processing and offering tapepaks for automatic equipping units. The mechanism comprises a cut-out tool at a processing position or station, which tool is composed of, respectively, at least one blanking die, one bending insert and an injector, said cut-out tool cooperates with a punch-type die. The punch has two initial positions, with the first initial position being used during a cutting stroke and the second initial position, which is lower than the first initial position, being used during the bending stroke after the intraposition of a bending transfer insert and means for offering the tapepak that has been cut-out and has been provided with the terminal legs bent already for assembly, said means for offering providing reproducible positioning on the bending transfer insert at the transfer position, wherein the bending transfer insert is displaceable with a slide between the transfer position and the processing position.

The invention is based on the perception that the reproducible positioning of a completely processed tapepak at a transfer position critical for an automatic equipping unit can be realized by the utilization of a mechanism, for example by a delivery module for an automatic equipping unit, that contains the elements recited above. These elements interact so that, following a cut-out and following a bending event for the terminal legs of the tapepak, the tapepak itself is immediately aligned on the appertaining bend-transfer insert, in a reproducible position. The same respective punch is employed for the cutting stroke and for the bending stroke, but is started proceeding from different initial positions. The punch stroke is approximately the same in both instances. The second, deeper initial position of the punch, however, enables that the bend-transfer insert can be placed between the punch and cutter tool. The bending event is carried out by collaboration of the cutting tool and the bend-transfer insert upon actuation of the punch. The tapepak now fixed on the bend-transfer insert can be conveyed together therewith from the processing position to the transfer position, and is conveyed with a slide.

An advantageous development of the invention provides that the positioning of the tapepak relative to the individual tools is carried out from the start. This means that the tapepak is positioned or centered in or on the die, as it is within the cutting plate and subsequently on the bend-transfer insert as well. During processing, the tapepak is transferred a total of four times, namely from the acceptance opening in the slide to the punch, to the cut-out tool during the cut-out event, to, or, respectively, on to the bend-transfer insert during the bending event, and by removal from the bend-transfer insert that has been moved to the transfer position in the meantime, and is transferred therefrom by means of an equipping head, for example, with a suction pipette. This development of the invention sees to a reproducible positioning of the tapepak within the overall mechanism that is effective from the start.

A further advantageous development of the invention provides that the bend-transfer insert is positionable relative to the cut-out tool on the basis of at least one spring-seated centering pin together with an appertaining centering bore. This has the advantage that imprecisions in the movement of the slide that conveys the bend-transfer insert are compensated.

The bend-transfer insert itself can be advantageously positioned at the transfer position with centering pins and centering bores.

When the stroke length of the slide that conveys the bend-transfer insert from the transfer position to the processing position is taken into consideration given installation of a delivery unit for the tapepaks to be processed, then it advantageously follows that the empty acceptance opening of the slide comes to lie at or under the delivery unit simultaneously with the displacement of the bend-transfer insert into the processing position and a further tapepak can be accepted.

The removal of the frame of the tapepak from the acceptance opening of the slide after the cutting event advantageously occurs by opening the floor in the slide during a second work step of the slide on its path from the processing position to the delivery position.

DESCRIPTION OF THE PREFERRED EMBODIMENTS

Figure 1:
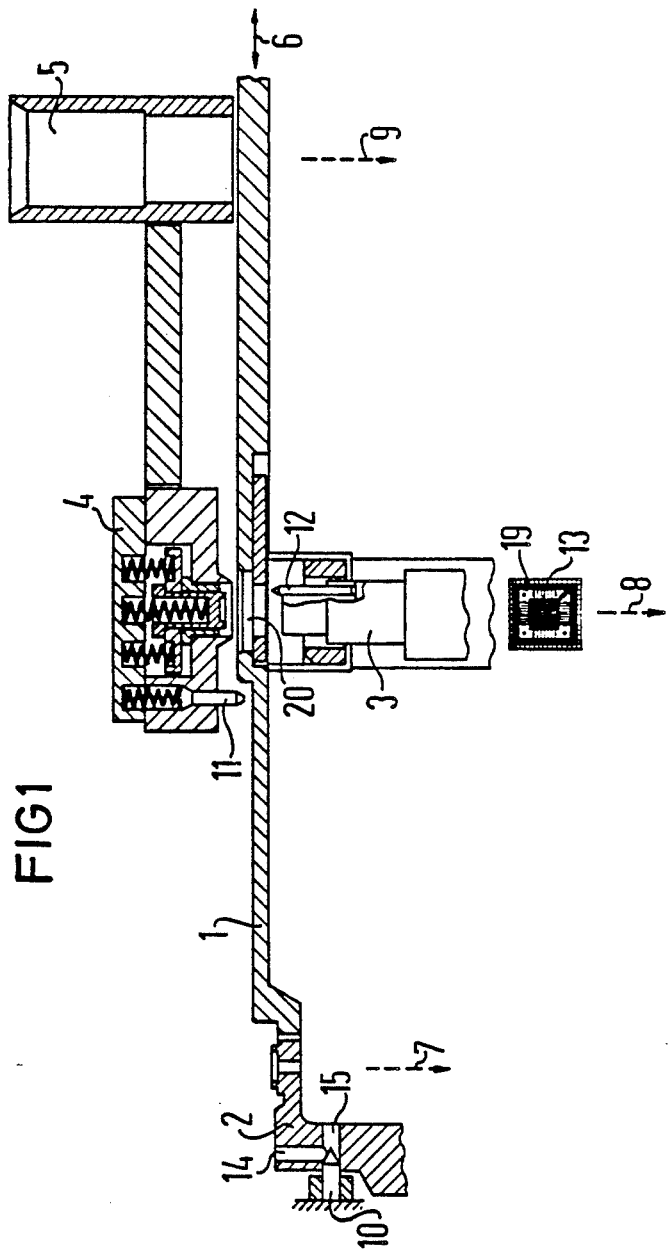
FIG. 1 is a cross sectional view of the critical component parts of the mechanism of the invention and has a tapepak illustrated in the plane of the drawing.

FIG. 1 shows a tapepak 13 which is placed into the plane of the drawing and comprises three centering bores 19. This tapepak 13 shows the actual component part in the form of the inner square, with the terminal legs thereof that extend perpendicularly from all of the four sides and that the outer frame is a square. This tapepak 13 is centered with the centering pins 12 at the processing position 8, whereby it is situated in the acceptance opening 20 of the slide 1, and a cut-out stroke of the die or punch 3 of about 12 mm separates the tapepak into the actual component part with its terminal legs and the outer frame that is no longer connected to the component. The cut-out tool 4 forms the corresponding cooperating element for this operation. The slide 1, having the moving direction 6, is movable with two different work steps that the acceptance opening 20 comes to lie under the cutting tool 4 in the processing position or station 8 on the one occasion and comes to lie under the delivery or supply unit 5 on another occasion.

Correspondingly, the bend-transfer insert 2 is situated at a transfer position or station 7 on the one occasion and is situated at the processing position 8 on another occasion. After the conclusion of the cut-out event, for example, an equipping head comprising a suction pipette takes a completely processed tapepak that may be situated on the bend-transfer insert 2 at the transfer position 7. After that, the described movement toward the right is accomplished by the first work step or clock of the slide 1. The tapepak 13 is clamped in the cutter plate 18 (FIG. 2) in self-feeding fashion from the preceding cut-out event and, already without its appertaining frame, is brought into the final form for mounting on a printed circuit board by the subsequent bending stroke that the punch 3 accomplishes from the lower position with the bend-transfer insert 2 inserted therebetween and given cooperation of the cutter tool 4. The tapepak 13 is thereby positioned with reproducible precision on the upper side or surface of the bend-transfer insert 2 that is fashioned as a bending matrix. The punch or die 3 thereby again executes a stroke that is 12 mm long, but executes this from an initial position that lies about 6 mm lower. This is necessary so that the bend-transfer insert 2 can be inserted between the punch 3 and the cut-out tool 4.

Simultaneously with the events that have just been set forth, the outer frame of the tapepak 13 that was placed back into the acceptance opening 2 of the slide after the cutting stroke upon retraction of the punch 3 has fallen down during the first work step of the slide 1 onto a constantly running conveyor belt via a funnel by opening or removing a floor under the opening 20 of the slide 1. The fall of the waste frame is promoted by brushes. At the end of the first work step of the slide, the acceptance opening 20 is situated under the delivery unit or supply station 5 and accepts the next tapepak 13 that is to be processed.

The execution of the bending stroke at the processing position 8 that has already been mentioned provides that an ejector in the cutter tool 4 sees to it at the end of the bending stroke that the tapepak 13 remains lying on the bend-transfer insert 2 and does not remain clamped in the die 18 or on the bend insert 16. The slide 1 is returnable into its original position with a second work step or clock, so that the bend-transfer insert 2 is situated at the transfer position 7 and the acceptance opening 20 of the slide 1 is situated at the processing position 8 with a tapepak 13 to be processed.

Figure 2:
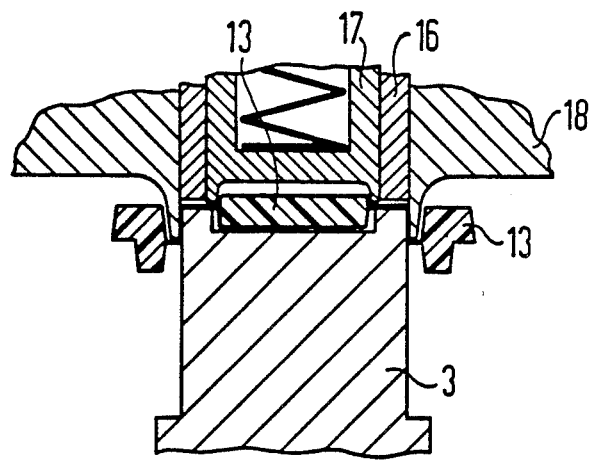
FIG. 2 is an enlarged cross sectional view of the collaboration between a disk and the cut-out tool shortly after the cut-out event.

FIG. 2 shows the cut-out event in greater detail. The usable tapepak 13 situated in the middle has been pressed upward into the blanking die 18 by the cutting stroke of the punch 3. The spring-seated component parts—the bend insert 16 and the ejector 17—have not yet been activated. It may be seen that the frame of the tapepak 13 remains outside of the punch 3 and is placed back into the slide 1 and into the acceptance opening 20 given the return motion of the punch 3. The cut-out, usable tapepak 13 is clamped in the blanking die 18 in a self-supporting fashion due to the properties of the cut-out event that has slightly bent the terminal legs of the tapepak 13 as a result of the shearing events. The usable part of the tapepak 13 will, thus, remain in the blanking die 18 when the punch 3 returns. The bend-transfer insert 2 is centered at the processing position 8 due to at least one spring-seated centering pin 11 and accepts the pre-positioned tapepak 13 during the bending event.

Figure 3:
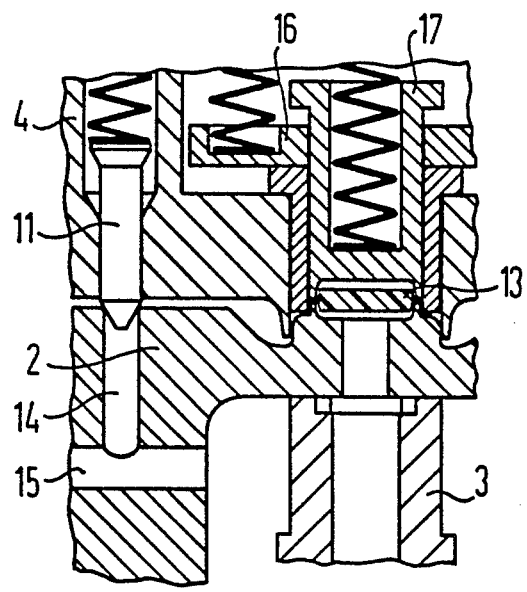
FIG. 3 is a cross sectional view of a tapepak centered on the bend-transfer insert having bent terminal legs after the conclusion of the bending event.

As FIG. 3 shows, the upper side of the bend-transfer insert 2 is shaped such that the terminal legs of the tapepak 13 are bent like a Z with 90° angles. The legs are bent by means of the bend insert 16 that is composed of four parts corresponding to the four sides of the component part in this case and by means of the ejector 17. At the return motion of the punch 3 during the bending stroke, the ejector 17 sees to it that the component part is pressed out together with the departing bend-transfer insert 2. The ejector 17 and the bend insert 16 are all spring-seated. It may also be seen in FIG. 3 that the centering bore 14 interacts with the centering pin 11. The centering bore 15 that interacts with the centering pin 10 in the transfer position 7 is shown in FIG. 1.

The movement of the punch 3 and of the slide 1 are expediently executed with electric motors. Via, for example, a crank mechanism and rocker, an electric motor or a geared motor as well is responsible for the cut-out and bending stroke with the respective back and forth motion on the basis of respectively one 360° revolution of the crank disc. Due to a respective 180° movement of the crank disc, another electric motor that is likewise provided with a gearing is responsible for the two work strokes of the slide 1 an is simultaneously responsible for setting the respective initial position of the punch 3 for either the cut-out event or the bending event. The initial position of the punch 3 for the bending event thereby lies about 6 mm lower than the initial position for a cut-out stroke.

Although various minor modifications may be suggested by those versed in the art, it should be understood that we wish to embody within the scope of the patent granted hereon all such modifications as reasonably and properly come within the scope of our contribution to the art.

We claim:

1. A mechanism for processing an operating tapepaks for automatic equipping units, said mechanism comprising a punch and a cut-out tool at a processing position, said cut-out tool being composed of at least one blanking die receiving one bending insert and an ejector, said cut-out tool cooperating with the punch, a slide having a bend-transfer insert and a tapepak holder spaced apart by a given distance, said slide being movable between two initial positions with the first initial position having the tapepak holder being positioned at the processing position and a second initial position with the bend-transfer insert being disposed at said processing position, and means for insuring reproducible positioning of the bend-transfer insert at a transfer position and at the processing position so that the bend-transfer insert is displaceable with the slide between the transfer position and the processing position.

2. A mechanism according to claim 1, wherein the means for insuring reproducible positioning includes a centering pin associated with the punch being received in a bore of the tapepak, positioning of the cut tapepak being assured by clamping the cut tapepak into the blanking die in a self-supporting fashion, the positioning of the tapepak on the bend-transfer insert being accomplished by the ejector moving the process tapepak insert after the bending step onto a bending matrix surface of the bend-transfer insert so that the bent tapepak can be displaced with the bend-transfer insert to the transfer position subsequent to completion of the processing steps.

3. A mechanism according to claim 2, wherein the positioning of the bend-transfer insert relative to the cut-out tool utilizes at least one spring-seated centering pin and at least one centering bore.

4. A mechanism according to claim 3, wherein the precise positioning of the bend-transfer insert at the transfer position is accomplished by means of utilizing at least one centering pin and at least one centering bore.

5. A mechanism according to claim 1, which further includes said tapepak holder having means for receiving the removed frame of the tapepak during the cut-out event, said holder comprising an opening in the slide having a floor, said floor being removable from said opening as the slide moves to the second initial position to allow removal of the removed frame.

6. A mechanism according to claim 1, which includes a supply unit spaced said given distance from the processing position so that a movement of the slide to said second initial position locates the holder at the supply unit to receive the next tapepak.

7. A mechanism for processing and offering tapepaks for automatic equipping units, said mechanism having a supply station at which tapepaks with an outer frame are provided, a processing station, and a transfer station, said processing station including a punch cooperating with a cut-out tool, said cut-out tool comprising at least one blanking die receiving one bending insert and an ejector, a slide movable between the punch and the cut-out tool, said slide having a tapepak holder and having a bend-transfer insert spaced from said holder, means for moving the slide between first and second positions, the first position having the tapepak holder at the processing station and the bend-transfer insert at the transfer station and the second position having the bend-transfer insert at the processing station and the tapepak holder at the supply station.

* * * * *